(12) United States Patent
Zarei et al.

(10) Patent No.: US 8,264,392 B1
(45) Date of Patent: Sep. 11, 2012

(54) COMPACT HIGH-SPEED ANALOG-TO-DIGITAL CONVERTER FOR BOTH I AND Q ANALOG TO DIGITAL CONVERSION

(75) Inventors: Hossein Zarei, Irvine, CA (US); Chieh-Yu Hsieh, Irvine, CA (US)

(73) Assignee: Marvell International Ltd. (BM)

( * ) Notice: Subject to any disclaimer, the term of this patent is extended or adjusted under 35 U.S.C. 154(b) by 49 days.

(21) Appl. No.: 12/963,347

(22) Filed: Dec. 8, 2010

Related U.S. Application Data

(60) Provisional application No. 61/285,110, filed on Dec. 9, 2009.

(51) Int. Cl.
*H03M 1/12* (2006.01)

(52) U.S. Cl. .......................... 341/156; 341/155; 341/159

(58) Field of Classification Search ........... 341/140–170
See application file for complete search history.

(56) References Cited

U.S. PATENT DOCUMENTS

| | | | |
|---|---|---|---|
| 5,646,621 A * | 7/1997 | Cabler et al. .................. 341/143 |
| 6,456,950 B1 * | 9/2002 | El-Ghoroury et al. .......... 702/75 |
| 6,515,607 B2 * | 2/2003 | Liu et al. ....................... 341/143 |
| 6,556,158 B2 * | 4/2003 | Steensgaard-Madsen .... 341/131 |
| 7,194,036 B1 * | 3/2007 | Melanson ..................... 375/247 |
| 7,215,269 B2 * | 5/2007 | Lee et al. ....................... 341/143 |
| 7,365,667 B1 * | 4/2008 | Nanda et al. .................. 341/143 |
| 7,466,256 B2 * | 12/2008 | Brueske et al. ............... 341/143 |
| 7,515,072 B2 * | 4/2009 | Borisavljevic ................. 341/53 |
| 7,710,299 B2 * | 5/2010 | Hoang et al. .................. 341/141 |
| 7,868,799 B1 * | 1/2011 | Price et al. .................... 341/137 |
| 7,880,656 B2 * | 2/2011 | Ahn .............................. 341/155 |
| 7,928,878 B1 * | 4/2011 | Coban et al. .................. 341/143 |

* cited by examiner

*Primary Examiner* — Lam T Mai (57) ABSTRACT

An analog-to-digital converter (ADC) and a receiver that includes the ADC is disclosed. The ADC includes a first filter configured to receive a signal in an I-signal path of the receiver and a second filter configured to receive a signal in a Q-signal path of the receiver. The ADC further includes a quantizer alternatingly in connection with the first and second filters, and at least one DAC alternatingly in connection with the first and second filters. Switches in the ADC are configured to alternate connection between an input of the quantizer and outputs of the first and second filters, and are also configured to alternate connection between an output of the at least one DAC and inputs of the first and second filters.

15 Claims, 9 Drawing Sheets

FIG. 10

COMPACT HIGH-SPEED ANALOG-TO-DIGITAL CONVERTER FOR BOTH I AND Q ANALOG TO DIGITAL CONVERSION

RELATED APPLICATION

This application claims the benefit of U.S. Provisional Application No. 61/285,110, filed Dec. 9, 2009, which is incorporated herein by reference in its entirety.

BACKGROUND

Figure 1:
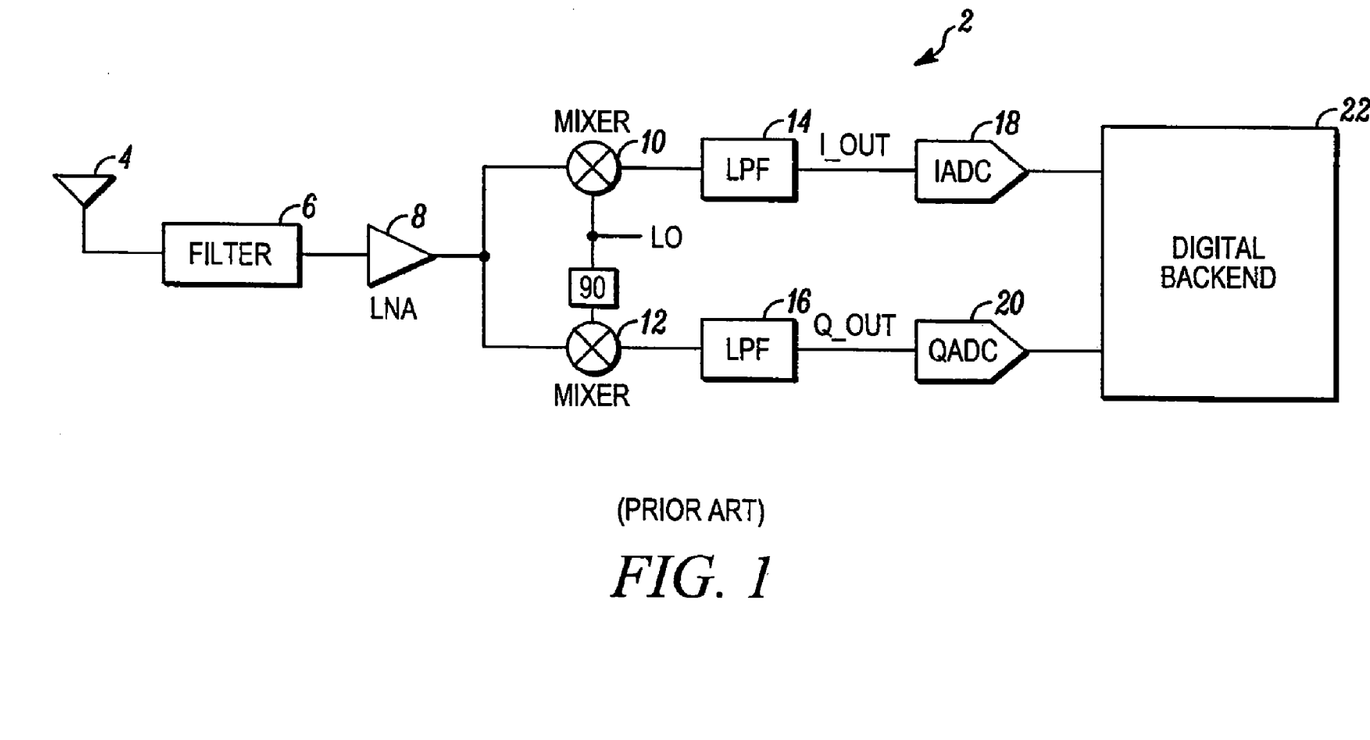
FIG. 1 is a block diagram of a quadrature down-conversion receiver that is known in the prior art.

Analog-to-digital converters (ADC) are one of the main components of an electronic receiver. Many receivers are based on a direct-conversion topology, which is employed for receivers that are compatible with multiple standards having different communication frequency bandwidths. The direct-conversion topology utilizes quadrature down-conversion, which includes creating in-phase (I) and quadrature (Q) base-band signals from radio frequency (RF) input signals received by an antenna. FIG. 1 shows a receiver 2 employing the direct-conversion topology. In FIG. 1, an antenna 4 receives an RF signal and sends the RF signal to a filter 6. The output of the filter 6 is amplified by a low noise amplifier (LNA) 8, and the output of the LNA 8 is applied to RF inputs of two mixers 10, 12. The two mixers 10, 12 down convert the RF input signal from the LNA 8 to an I-signal and a Q-signal at base-band frequency using a local oscillator (LO) signal. Typically, the Q-signal is ninety-degrees out of phase with the –I signal. The mixed-down I and Q-signals are filtered using low pass filters 14, 16. After being filtered, the I and Q-signals are input into two ADCs, an I-ADC 18 and a Q-converts the Q-signal to a digital signal. The digital output signals of the I-ADC 18 and Q-ADC 20 are sent to a digital backend 22 for digital processing.

Standards used for wireless communications, such as IEEE 802.11 and Global System for Mobile Communications (GSM), require large frequency bandwidths for each frequency channel so that devices used in wireless environments (e.g., smart phones) can transmit and receive high data rates. When seeking to decrease the size of devices, one common way to reduce the size of the receivers is by reducing the number of stages of the filters in the receiver. However, reducing the number of stages decreases the performance of the filters. In order to offset the decrease in performance of the filters due to the reduction in the number of stages, ADCs having high bandwidth and low noise (i.e., high signal-to-noise (SNR)) performance characteristics are desired.

One type of ADC that yields a high SNR is a sigma-delta ADC. However, in order to meet the high SNR requirement for high-bandwidth signals, the sigma-delta ADC requires at least one multi-bit digital-to-analog converter (DAC), and typically multiple DACs, configured in a feedback loop. For example, a third-order ADC may require three DACs in a feedback loop. In the sigma-delta ADC, after the input signal is sampled by a quantizer, the sampled signal is input to one or more DACs in a feedback loop. Because conventional direct-conversion receiver topologies utilize two ADCs—one for receiving the I signal and one for receiving the Q signal—the total number of quantizers and DACs required is large. The use of multiple DACs in two ADCs thus makes it difficult to decrease the overall size of the analog-to-digital circuitry in a direct-conversion receiver.

BRIEF SUMMARY

The present disclosure describes an analog-to-digital converter (ADC) that includes a quantizer, a first filter, a second filter, at least one digital-to-analog converter (DAC), and a multiplexer configured to alternate connection of the quantizer with the first filter and the second filter, and to alternate connection of the at least one DAC with the first filter and the second filter. In the ADC, the first filter is connected to the at least one DAC when the quantizer is connected to the second filter, and the second filter is connected to the at least one DAC when the quantizer is connected to the first filter. During a first half of a clock cycle, the first filter is connected to the at least one DAC and the quantizer is connected to the second filter. During a second half of the clock cycle, the second filter is connected to the at least one DAC and the quantizer is connected to the first filter.

In one embodiment, the multiplexer in the ADC includes a first switch configured to alternate connection of an input of the quantizer with an output of the first filter and an output of the second filter; and a second switch configured to alternate connection of an output of the DAC with an input of the first filter and an input of the second filter. In another embodiment, the multiplexer includes a first switch configured to alternate connection of an input of the quantizer with an output of the first filter and an output of the second filter. The DAC is configured to alternatingly output an analog signal to the first filter and the second filter. The DAC includes a plurality of switches; and a plurality of current paths connected in parallel. The current paths are in connection with the plurality of switches. The plurality of switches controls current flow through the plurality of current paths. The analog signal is based on the current flow through the plurality of current paths.

The plurality of switches in the DAC includes a first set of switches and a second set of switches. Each of the plurality of current paths has one switch from the first set of switches and one switch from the second set of switches. The first set of switches is controlled by a signal based on the output of the quantizer, and the second set of switches is controlled by a clock signal.

The present disclosure also describes a receiver that includes a first path configured to transmit an I-signal, a second path configured to transmit a Q-signal, and an analog-to-digital converter (ADC) configured to receive the I-signal and the Q-signal. The ADC in the receiver includes a first filter configured to receive the first signal, a second filter configured to receive the second signal, a quantizer alternatingly in connection with the first filter and the second filter, at least one digital-to-analog converter (DAC) alternatingly in connection with the first filter and the second filter; and a multiplexer configured to alternate connection of the quantizer with the first filter and the second filter, and to alternate connection of the at least one DAC with the first filter and the second filter.

In the ADC of the receiver, the first filter is connected to the at least one DAC when the quantizer is connected to the second filter, and the second filter is connected to the at least one DAC when the quantizer is connected to the first filter. During a first half of a clock cycle, the first filter is connected to the at least one DAC and the quantizer is connected to the second filter. During a second half of the clock cycle, the second filter is connected to the at least one DAC and the quantizer is connected to the first filter.

In one embodiment of the ADC in the receiver, the multiplexer includes a first switch configured to alternate connection of an input of the quantizer with an output of the first filter and an output of the second filter, and a second switch configured to alternate connection of an output of the DAC with an input of the first filter and an input of the second filter. In another embodiment of the ADC in the receiver, the first switch is configured to alternate connection of an input of the quantizer with an output of the first filter and an output of the second filter, and the DAC is configured to alternatingly output an analog signal to the first filter and the second filter.

The DAC includes a plurality of switches and a plurality of current paths connected in parallel. The current paths are in connection with the plurality of switches. The plurality of switches controls current flow through the plurality of current paths. The analog signal is based on the current flow through the plurality of current paths. The plurality of switches comprises a first set of switches and a second set of switches, each of the plurality of current paths having one switch from the first set of switches, and each of the plurality of current paths having one switch from the second set of switches. The first set of switches is controlled by a signal based on the output of the quantizer. The second set of switches is controlled by a clock.

DETAILED DESCRIPTION

The present disclosure describes an analog-to-digital converter (ADC) used in a receiver having a direct-conversion topology. Both the I-signal and the Q-signal in the receiver are received by the ADC. The I-signal is sent to an I-filter in the ADC, and the Q-signal is sent to a Q-filter in the ADC. A quantizer in the ADC samples both the I-signal and the Q-signal. A DAC in a feedback loop in the ADC injects current into the I-filter and the Q-filter. The ADC is configured to operate so that when the quantizer is sampling a signal from one filter, the DAC is injecting current to the other filter. A single ADC to receive the I-signal and the Q-signal and convert the I-signal and the Q-signal to digital signals uses fewer DACs and quantizers than when one ADC is used for each of the I-signal and the Q-signal.

Figure 2:
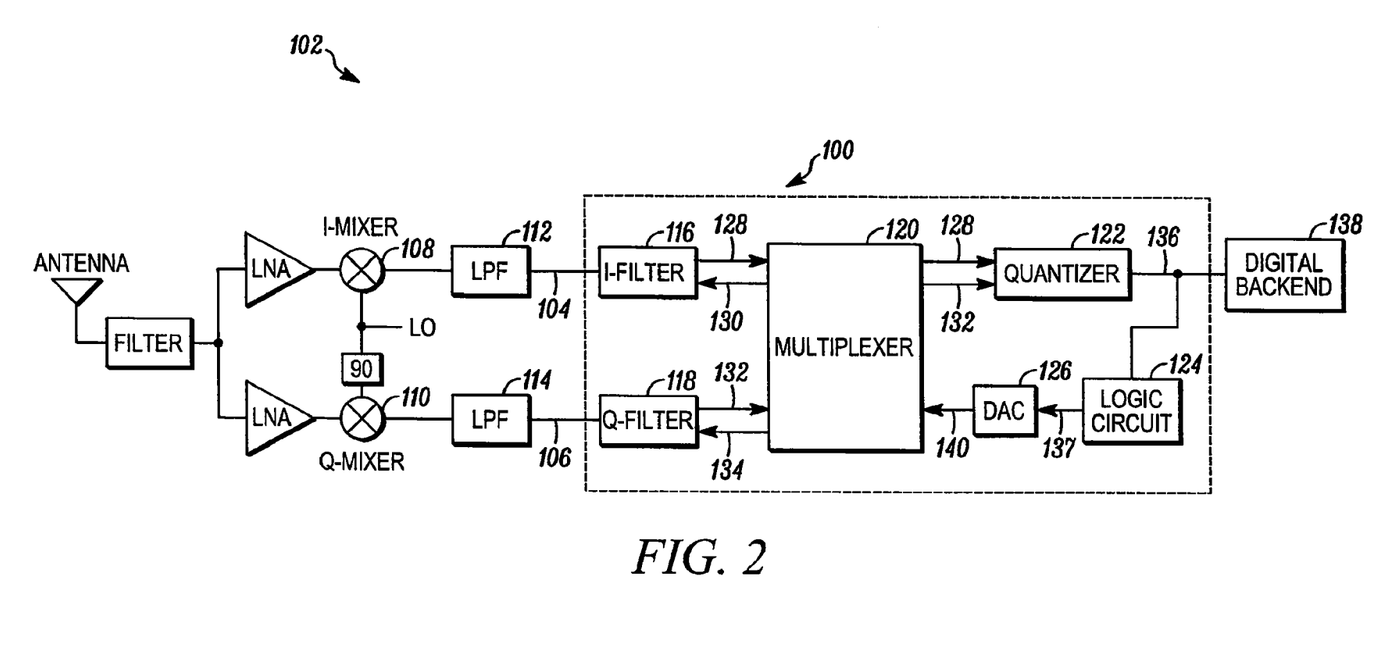
FIG. 2 is a schematic block diagram of one embodiment of an analog-to-digital converter (ADC).

FIG. 2 illustrates an analog-to-digital converter (ADC) 100 configured in a receiver 102 having a direct-conversion topology. The ADC 100 is configured to receive I-signal 104 and Q-signal 106. In one embodiment of the receiver 102, the I-signal 104 and the Q-signal 106 have been down-converted by I, Q mixers 108, 110 and filtered by low pass filters 112, 114 prior to being input into the ADC 100. The ADC 100 includes an I-filter 116, a Q-filter 118, a multiplexer 120, a quantizer 122, a logic circuit 124, and a digital-to-analog converter (DAC) 126. The I-filter 116 is configured to receive the I-signal 104. In addition, the I-filter 116 is configured to send a signal 128 to the multiplexer 120 and receive a signal 130 from the multiplexer 120. The Q-filter 118 is configured to receive the Q-signal 106. In addition, the Q-filter 118 is configured to send a signal 132 to the multiplexer 120 and receive a signal 134 from the multiplexer 120.

The multiplexer 120 is configured to receive signal 128 from the I-filter 116 and signal 132 from the Q-filter 118. Additionally, the multiplexer 120 is configured to send signal 130 to the I-filter 116 and signal 134 to the Q-filter 118. The multiplexer 120 is configured to alternatingly receive signal 128 from the I-filter 116 and signal 132 from the Q-filter 118. The multiplexer 120 may comprise one or more switches, such as switch 142 and switches 144a, 144b, 144c, as discussed in FIG. 3. Also, as discussed in more detail below, when the multiplexer 120 is configured to receive signal 128 from the I-filter 116, the multiplexer 120 is configured not to receive signal 132 from the Q-filter 118. When the multiplexer 120 is configured to receive signal 132 from the Q-filter 118, the multiplexer 120 is configured not to receive signal 128 from the I-filter 116. In addition, the multiplexer 120 is configured to send signal 128 and signal 132 to the quantizer 122. The quantizer 122 converts analog signals 128, 132 into a signal 136 having values that are identical to analog signals 128, 132 only at discrete instants of time. The multiplexer 120 is configured to alternatingly send signal 128 and signal 132 to the quantizer 122. As discussed below with respect to FIG. 3, switch 142 may be used to send signals 128 and 132 to the quantizer 122. When the multiplexer 120 is configured to send signal 128 to the quantizer 122, the multiplexer 120 is configured not to send signal 132 to the quantizer 122. When the multiplexer 120 is configured to send signal 132 to the quantizer 122, the multiplexer 120 is configured not to send signal 128 to the quantizer 122.

As shown in FIG. 2, the multiplexer 120 is further configured to send signal 130 to the I-filter 116 and signal 134 to the Q-filter 118. The multiplexer 120 may be configured to send signal 130 to the I-filter 116 and signal 134 to the Q-filter to improve the signal-to-noise ratio of ADC 100. The multiplexer 120 is configured to alternatingly send signal 130 to the I-filter 116 and signal 134 to the Q-filter 118. As discussed below with respect to FIG. 3, switches 144a, 144b, 144c may be used to send signal 130 to the I-filter 116 and signal 134 to the Q-filter 118. When the multiplexer 120 is configured to send signal 130 to the I-filter 116, the multiplexer 120 is configured not to send signal 134 to the Q-filter 118. When the multiplexer 120 is configured to send signal 134 to the Q-filter 118, the multiplexer 120 is configured not to send signal 130 to the I-filter 116.

The quantizer 122 is configured to receive signal 128 and signal 132. In addition, the quantizer 122 is configured to sample signal 128 and signal 132, and output ADC output signal 136. ADC output signal 136 is based on signal 128 and signal 132. ADC output signal 136 is based on sampled signals 128 and sampled signal 132, where signal 128 and signal 132 have been alternatingly sampled by the quantizer 122. For example, when the quantizer 122 receives signal 128, the quantizer 122 samples signal 128, and ADC output signal 136 is based on sampled signal 128. When the quantizer 122 receives signal 132, the quantizer 122 samples signal 132, and ADC output signal 136 is based on sampled signal 132. The quantizer 122 samples signal 128 and signal 132 at a frequency much greater, such as at least two times greater, than the data symbol rate of the signal received at the antenna. By sampling at a frequency much greater than the data symbol rate, signal 128 and signal 132 can be alternatingly sampled. Receiver 102 may be configured to send ADC output signal 136 from ADC 100 to a digital backend 138.

In one embodiment, ADC 100 is configured to send ADC output signal 136 to DAC 126 in a feedback loop. As shown in FIG. 2, ADC 100 may include logic circuit 124. Logic circuit 124 is configured to receive ADC output signal 136 and output digital signal 137 to DAC 126. As explained in further detail below, logic circuit 124 is configured to output digital signal 137 as a return-to-zero (RZ) signal. If it is not necessary for DAC 126 to receive RZ signals, logic circuit 124 may not be included in ADC 100.

DAC 126 is configured to convert the output of the quantizer 122, whether the output is received directly from quantizer 122 as ADC output signal 136 or from logic circuit 124 as RZ digital signal 137, to an analog signal 140. Analog signal 140 is a current signal. DAC 126 sends analog signal 140 to the multiplexer 120. Analog signal 140 has an I-component based on signal 128, and a Q-component based on signal 132. As shown in FIG. 2, the I-component of signal 140 is representative of signal 130, and the Q-component of signal 140 is representative of signal 134. As described above, the multiplexer 120 is configured to send signal 130 to the I-filter 116 and signal 134 to the Q-filter 118.

Figure 3:
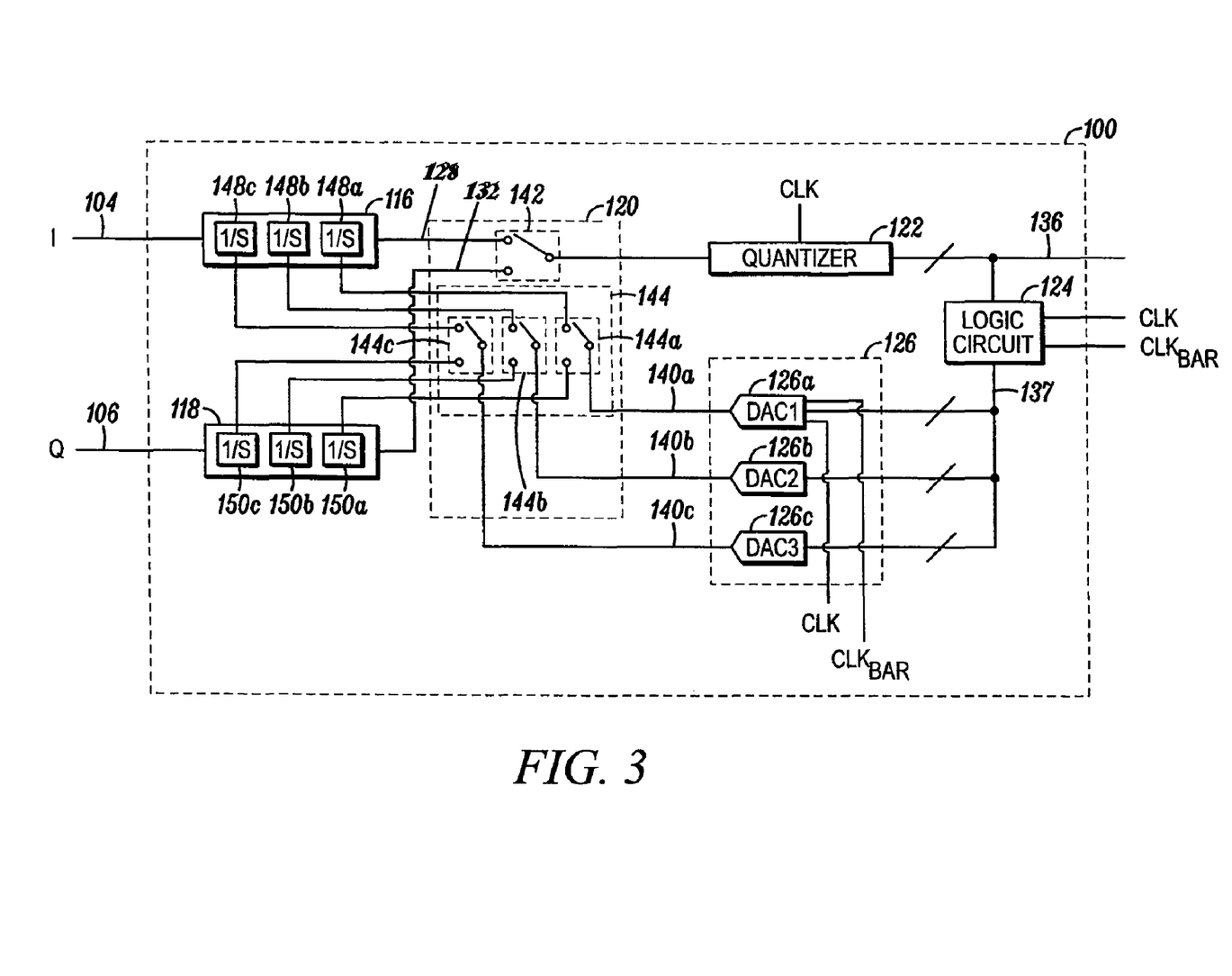
FIG. 3 is a schematic block diagram of the embodiment of the ADC shown in FIG. 2, illustrating in greater detail the switches and the signal paths of the ADC.

FIG. 3 shows the multiplexer 120 of ADC 100 in greater detail. Multiplexer 120 includes switch 142 and switch 144. Switch 142 alternates electrical connection between the quantizer 122 and the I-filter 116 and the Q-filter 118. When switch 142 connects the input of the quantizer 122 with the output of I-filter 116, an open circuit exists between the input of the quantizer 122 and the output of the Q-filter 118. When switch 142 connects the input of the quantizer 122 with the output of the Q-filter 118, an open circuit exists between the input of the quantizer 122 and the output of the I-filter 116.

Switch 144 also alternates electrical connection between DAC 126 and the I-filter 116 and the Q-filter 118. As shown in FIG. 3, switch 144 alternates connection between an output of DAC 126 and an integrator 148 in the I-filter 116 and an integrator 150 in the Q-filter 118. When switch 144 connects the output of DAC 126 with integrator 148, an open circuit exists between the output of DAC 126 and integrator 150. When switch 144 electrically connects the output of DAC 126 with integrator 150, an open circuit exists between the output of DAC 126 and integrator 148.

Switch 144 may include one or more individual switches. The number of individual switches 144 is proportionate to the order of ADC 100. The order of ADC 100 corresponds to the number of DACs 126 provided in the feedback loop of the ADC 100. The number of DACs corresponds to the number of integrators 148, 150 included in the I-filter 116 and the Q-filter 118. FIG. 3 shows a third-order ADC having three DACs 126a-c, three integrators 148a-c in the I-filter 116, three integrators 150a-c in the Q-filter 118, and three switches 144a-c. As shown in FIG. 3, switch 144a alternates connection between the output of DAC 126a and integrator 148a and integrator 150a, switch 144b alternates connection between the output of DAC 126b and integrator 148b and integrator 150b, and switch 144c alternates connection between the output of DAC 126c and integrator 148c and integrator 150c.

ADC 100 is configured to operate so that when the quantizer 122 is sampling a signal from one filter, DAC 126 is injecting current to the other filter. For example, when the quantizer 122 samples signal 128 from the I-path filter 116, DAC 126 converts DAC output signal 136 from the quantizer 122 to analog current signal 140 and injects analog signal 140 into the Q-filter 118. As shown in FIG. 3, when quantizer 122 samples signal 128 from the I-path filter 116, DAC1 126a injects analog signal 140a into integrator 150a, DAC2 126b injects analog signal 140b into integrator 150b, and DAC3 126c injects analog signal 140c into integrator 150c. Likewise, ADC 100 is configured to operate so that when the quantizer 122 samples signal 132 from the Q-path filter 118, DAC 126 converts DAC output signal 136 from the quantizer 122 to analog current signal 140 and injects analog signal 140 into the I-filter 116. As shown in FIG. 3, when quantizer 122 samples signal 132 from the Q-path filter 118, DAC1 126a injects analog signal 140a into integrator 148a, DAC2 126b injects analog signal 140b into integrator 148b, and DAC3 126c injects analog signal 140c into integrator 148c.

ADC 100 can have the described operability by configuring switch 142 and switch 144 to operate in sync, such as switching simultaneously. When switch 142 is switched to connect the output of the I-filter 116 with the input of the quantizer 122, switch 144 is configured to connect the output of DAC 126 with the Q-filter 118. Likewise, when switch 142 is configured to connect the output of the Q-filter 118 with the input of the quantizer 122, switch 144 is configured to connect the output of DAC 126 with the I-filter 116. By sampling a signal with the quantizer 122 from one filter when injecting current with the DAC 126 to the other filter, both the I-signal 104 and the Q-signal 106 can be received by one ADC using one quantizer and one set of DACs 126.

The switching operations of switch 142 and switch 144 are controlled by a clock input signal CLK. At a first half-cycle of CLK, switch 142 is configured such that the output of the I-filter 116 is connected with the input of the quantizer 122, and switch 144 is configured such that the output of DAC 126 is connected with the Q-filter 118. At a second half-cycle of CLK, switch 142 is configured such that the output of the Q-filter 118 is connected with the input of the quantizer 122, and switch 144 is configured such that the output of DAC 126 is connected with the I-filter 116.

Figure 4:
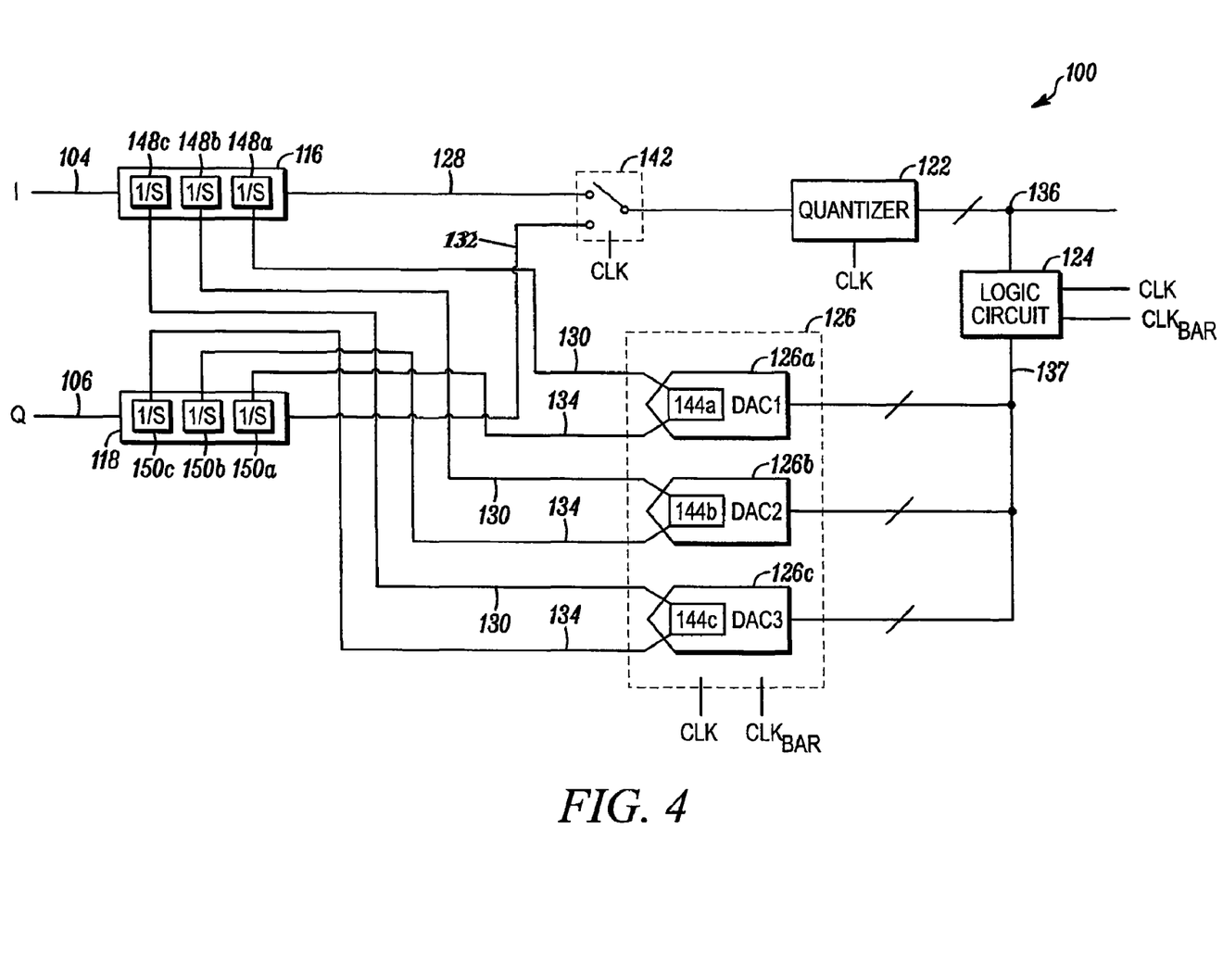
FIG. 4 is a schematic block diagram of another embodiment of the ADC, illustrating the DACs as providing alternating output to the filters.

In one configuration of DAC 126, DAC 126 is configured both to convert digital output signal 136 to current analog signal 140 and to absorb the operation of switch 144 by alternatingly outputting analog signal 140 to the I-filter 116 and the Q-filter 118. FIG. 4 illustrates ADC 100 where switch 144 is included as a component of DAC 126. As shown in FIG. 4, I-component 130 of analog signal 140 is sent to the I-filter 116 and Q-component 134 of analog signal 140 is sent to the Q-filter 118. DAC 126 is configured to alternatingly output I-component 130 and Q-component 134.

Shown in FIG. 4, in order for DAC 126 to alternatingly output I-component 130 and Q-component 134, digital signal 137, clock input signal CLK, and an inverse clock signal $CLK_{BAR}$ are input to switch 144 of DAC 126. Digital signal 137 is output from logic circuit 124 and is based on digital output signal 136 from the quantizer 122. At the first half clock cycle of CLK, DAC 126 outputs Q-component 134 of analog signal 140 to the Q-filter 118. At the second half clock cycle of CLK, DAC 126 outputs I-component 130 of analog signal 140 to the I-filter 116.

Figure 5:
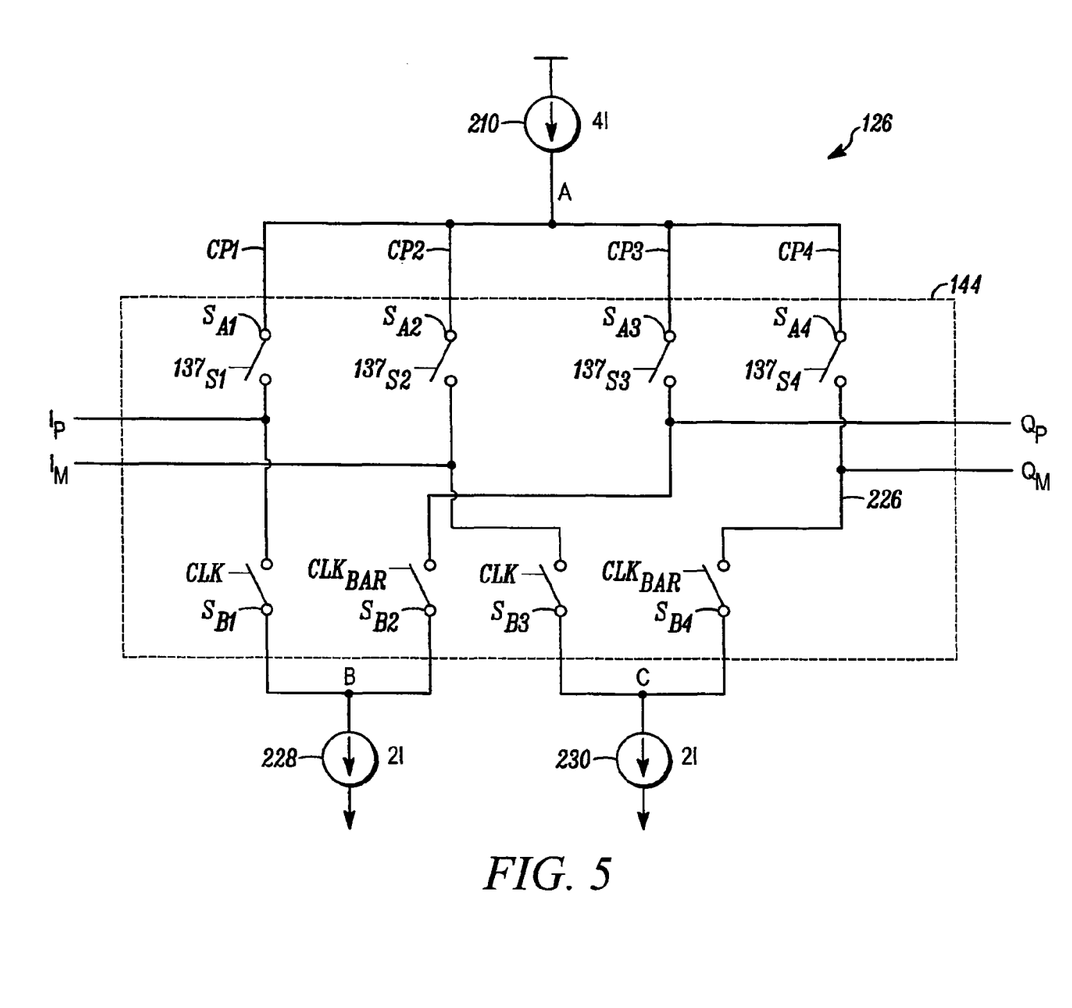
FIG. 5 is a schematic of the DAC shown in FIG. 4.

FIG. 5 shows a schematic diagram of one embodiment of DAC 126. DAC 126 includes a switch circuit 144 and a plurality of current paths CP1, CP2, CP3, CP4 connected in parallel. Current paths CP1-CP4 are connected together at one end at node A. In addition, CP1 and CP3 are connected together at node B, and CP2 and CP4 are connected at node C. Current from a current supply source 210 is supplied to node A and flows through current paths CP1-CP4. Current is drawn from node B by current source 228 and current is drawn from node C by current source 230.

The output signals of DAC 126, I-component 130 and Q-component 134 of analog signal 140, are taken from the current paths CP1-CP4. The output signals of DAC 126 comprise two differential signals, an I-differential output signal and a Q-differential output signal, where the I-differential output signal corresponds to I-component 130 and the Q-differential output signal corresponds to Q-component 134. The I-differential output signal comprises two differential output signals, $I_p$ and $I_m$. The Q-differential output signal comprises two differential output signals, $Q_p$ and $Q_m$. The I-differential output signal is taken off of first and second current paths CP1, CP2. Differential signal $I_p$ is taken off of first current path CP1. Differential signal $I_m$ is taken from second current path CP2. The Q-differential output signal is taken from third and fourth current paths CP3, CP4. Differential signal $Q_p$ is taken from third current path CP3. Differential signal $Q_m$ is taken from fourth current path CP4.

In order for DAC 126 to alternatingly output the I-differential output signal and the Q-differential output signal, when first current path CP1 and second current path CP2 draw current, third current path CP3 and fourth current path CP4 do not draw current. Similarly, when third current path CP3 and fourth current path CP4 draw current, first current path CP1 and second current path CP2 do not draw current.

Current flow through current paths CP1-CP4 is controlled by switch circuit 144. Switch circuit 144 includes a first set of switches $S_{A1}$-$S_{A4}$ and a second set of switches $S_{B1}$-$S_{B4}$. The first set of switches $S_{A1}$-$S_{A4}$ are connected in parallel. The second set of switches $S_{B1}$-$S_{B4}$ are connected in parallel. Current paths CP1-CP4 pass through switch circuit 144. Switch $S_{A1}$ and switch $S_{B1}$ are connected in series in first current path CP1. Switch $S_{A2}$ and switch $S_{B3}$ are connected in series in second current path CP2. Switch $S_{A3}$ and switch $S_{B2}$ are connected in series in third current path CP3. Switch $S_{A4}$ and switch $S_{B4}$ are connected in series in fourth current path CP4. When switch $S_{A1}$ and switch $S_{B1}$ are both closed, current flows through first current path CP1. When switch $S_{A2}$ and switch $S_{B3}$ are both closed, current flows through second current path CP2. When switch $S_{A3}$ and switch $S_{B2}$ are both closed, current flows through third current path CP3. When switch $S_{A4}$ and switch $S_{B4}$ are both closed, current flows through fourth current path CP4.

Switch circuit 144 operates such that when CP1 and CP2 draw current, CP3 and CP4 do not draw current. Similarly, switch circuit 144 operates such that when CP3 and CP4 draw current, CP1 and CP2 do not draw current. In order to achieve the alternating current draw, when $S_{A1}$ and $S_{B1}$ and $S_{A2}$ and $S_{B3}$ are closed to draw current through CP1 and CP2, respectively, at least one of $S_{A3}$ and $S_{B2}$ are open and at least one of $S_{A4}$ and $S_{B4}$ are open so that current is not drawn through CP3 and CP4. Similarly, in order to achieve the alternating current draw, when $S_{A3}$ and $S_{B2}$ and $S_{A4}$ and $S_{B4}$ are closed to draw current through CP3 and CP4, at least one of $S_{A1}$ and $S_{B1}$ are open and at least one of $S_{A2}$ and $S_{B3}$ are open so that current is not drawn through CP3 and CP4.

Operation of the first set of switches $S_{A1}$-$S_{A4}$ is controlled by digital signal 137. Digital signal 137 comprises four digital signals, $137_{S1}$, $137_{S2}$, $137_{S3}$, $137_{S4}$. $S_{A1}$ is controlled by digital signal $137_{S1}$. $S_{A2}$ is controlled by digital signal $137_{S2}$. $S_{A3}$ is controlled by digital signal $137_{S3}$. $S_{A4}$ is controlled by digital signal $137_{S4}$. Operation of the second set of switches $S_{B1}$-$S_{B4}$ is controlled by clock input signal CLK and inverse clock input signal $CLK_{BAR}$. $S_{B1}$ is controlled by CLK. $S_{B2}$ is controlled by $CLK_{BAR}$. $S_{B3}$ is controlled by CLK. $S_{B4}$ is controlled by $CLK_{BAR}$.

Since $S_{B1}$ and $S_{B3}$ are controlled by CLK and $S_{B2}$ and $S_{B4}$ are controlled by $CLK_{BAR}$, CP3 and CP4 are not drawing current if CP1 and CP2 are drawing current. However, as explained above, the current paths do not draw current unless both switches in the current path are closed. In order for the first set of switches $S_{A1}$-$S_{A4}$ to be closed when the respective switches in the second set of switches $S_{B1}$-$S_{B4}$ are closed, digital signal $137_{S1}$ and digital signal $137_{S2}$ follow the clock pattern of CLK and digital signal $137_{S3}$ and digital signal $137_{S4}$ follow the clock pattern of $CLK_{BAR}$.

Figure 7:
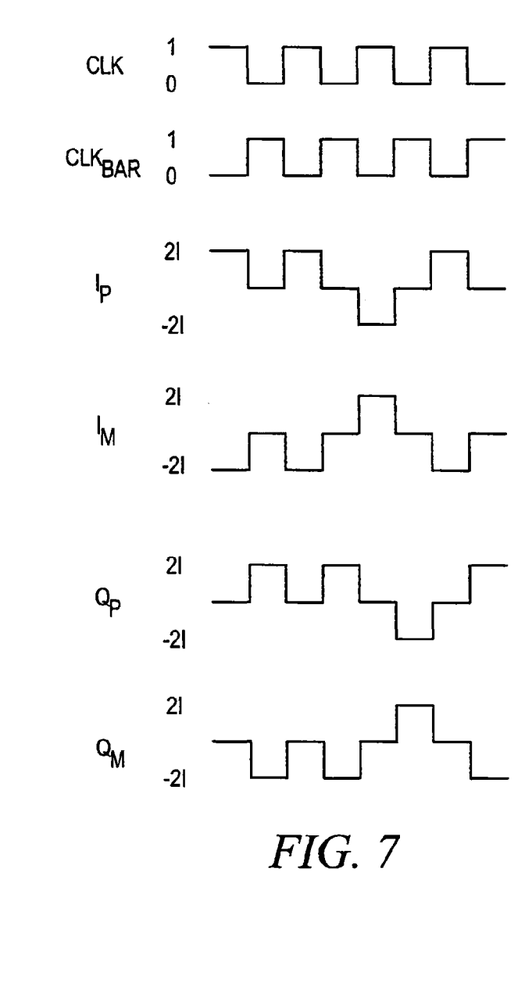
FIG. 7 is an example of a plot of the input clock signal, the inverse input clock signal, and the I and Q differential output signals from the DAC.

As shown in FIG. 7, input clock signal CLK and inverse clock signal $CLK_{BAR}$ are high for part of the clock cycle and are low for part of the clock cycle. Because digital signal $137_{S1}$ and digital signal $137_{S2}$ follow CLK, digital signal $137_{S1}$ and digital signal $137_{S2}$ are non-zero in magnitude for the portion of the clock cycle that CLK is high and are zero in magnitude for the portion of the clock cycle that CLK is low. Similarly, because digital signal $137_{S3}$ and digital signal $137_{S4}$ follow $CLK_{BAR}$, digital signal $137_{S3}$ and digital signal $137_{S4}$ are non-zero in magnitude for the portion of the clock cycle that $CLK_{BAR}$ is high and are zero in magnitude for the portion of the clock cycle that $CLK_{BAR}$ is low. Digital signals $137_{S1}$-$137_{S4}$ are considered return-to-zero (RZ) signals because digital signals $137_{S1}$-$137_{S4}$ are non-zero for a part of the clock cycle and then return to zero for the other part of the clock cycle. As RZ signals, digital signals $137_{S1}$-$137_{S4}$ do not transition from a non-zero magnitude to another non-zero magnitude without returning to a zero magnitude before the transition.

Figure 6:
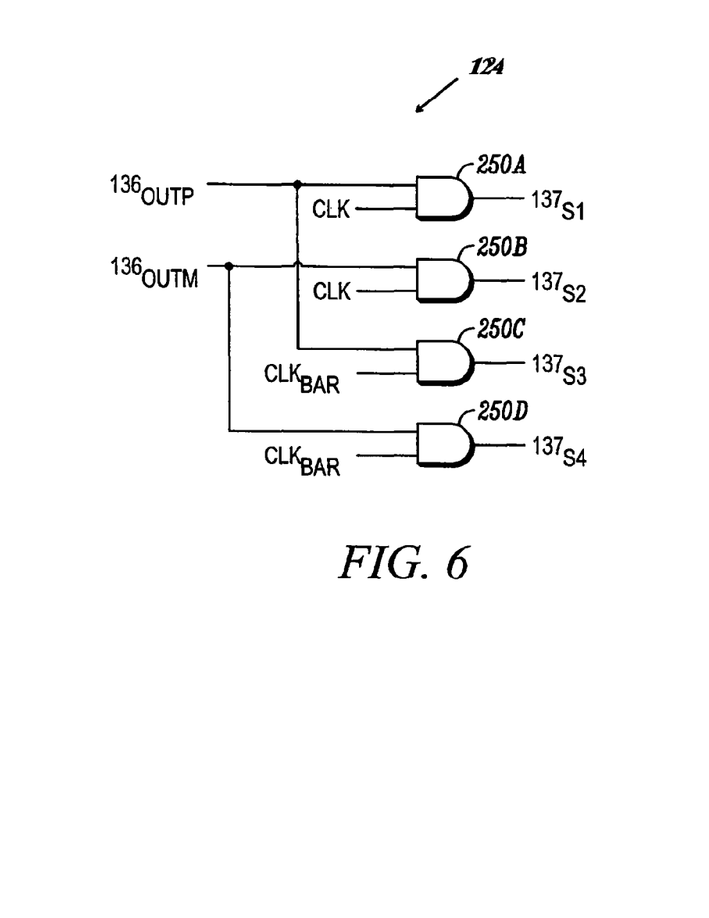
FIG. 6 is a schematic of the logic circuit shown in FIGS. 2-4 for generating return-to-zero signals that are output to the DAC.

As shown in FIG. 6, logic circuit 124 is configured to convert ADC output signal 136 from the quantizer 122 to four digital signals $137_{S1}$-$137_{S4}$ as RZ signals. ADC output signal 136 is a differential output signal comprising differential output signals $136_{Outp}$, $136_{Outm}$. Logic circuit 124 is configured to convert differential output signal $136_{Outp}$ to digital signal $137_{S1}$ and digital signal $137_{S3}$ as RZ signals, and to convert differential output signal $136_{Outm}$ to digital signal $137_{S2}$ and digital signal $137_{S4}$ as RZ signals.

Logic circuit 124 comprises four AND gates 250A-250D to convert differential output signals $136_{Outp}$, $136_{Outm}$ to digital signals $137_{S1}$-$137_{S4}$ as RZ signals. AND gate 250A is configured to receive differential signal $136_{Outp}$ and CLK, and is also configured to output digital signal $137_{S1}$. AND gate 250B is configured to receive differential output signal $136_{Outm}$ and CLK, and is also configured to output digital signal $137_{S2}$. AND gate 250C is configured to receive differential output signal $136_{Outp}$ and $CLK_{BAR}$, and is also configured to output digital signal $137_{S3}$. AND gate 250D is configured to receive differential output signal $136_{Outm}$ and $CLK_{BAR}$, and is also configured to output digital signal $137_{S4}$. AND gates 250A-D operate such that digital signals $137_{S1}$-$137_{S4}$ are based on differential output signals $136_{Outp}$, $136_{Outm}$ when CLK and $CLK_{BAR}$ are high and are a zero value when CLK and $CLK_{BAR}$ are low. Because CLK and $CLK_{BAR}$ are high for part of the clock cycle and low for part of the clock cycle, AND gates 250A-D having CLK and $CLK_{BAR}$ as inputs generate RZ signals.

CLK and $CLK_{BAR}$ are high for half of the clock cycle and are low for half of the clock cycle. As shown in FIG. 7, because CLK and $CLK_{BAR}$ are inversely related, during the first half of the clock cycle, CLK is high and $CLK_{BAR}$ is low. During the second half of the clock cycle, CLK is low and $CLK_{BAR}$ is high.

The following describes the operation of DAC 126. During the first half of the clock cycle, AND gate 250A receives a high signal from CLK, and sends digital signal $137_{S1}$ corresponding to differential output signal $136_{Outp}$ to switch $S_{A1}$. Likewise, AND gate 250B receives a high signal from CLK, and sends digital signal $137_{S2}$ corresponding to differential output signal $136_{Outm}$ to switch $S_{A2}$. Because the output signals $136_{Outp}$ and $136_{Outm}$ of the quantizer 122 are inversely related, one of the output signals $136_{Outp}$ and $136_{Outm}$ is at a high logic level and the other one of the output signals $136_{Outp}$ and $136_{Outm}$ is at a low logic level. Whether the output signals $136_{Outp}$ and $136_{Outm}$ are at high or low logic levels depends on the sign of the signals 128, 132 that are input to the quantizer 122. Accordingly, digital signals $137_{S1}$ and $137_{S2}$, which correspond to output signals $136_{Outp}$ and $136_{Outm}$, are also inversely related. Because digital signals $137_{S1}$ and $137_{S2}$ are inversely related, either switch $S_{A1}$ or switch $S_{A2}$ is closed, if CLK is high.

In addition, during the first half of the clock cycle, because CLK is high, both switch $S_{B1}$ and $S_{B3}$ are closed. If switch $S_{A1}$ is closed and switch $S_{A2}$ is open, current is drawn through first current path CP1. The current drawn to the differential output $I_p$ is the difference between the current of current source 210 (4I) and the current of current source 228 (2I). The difference in current is sent to the differential output $I_p$. In addition, because switch $S_{A2}$ is open and switch $S_{B3}$ is closed, current having a magnitude of −2I is drawn to the differential output $I_m$. Accordingly, differential output $I_p$ has a positive magnitude of +2I and the differential output $I_m$ has a negative magnitude of −2I. Similarly, if switch $S_{A1}$ is open and switch $S_{A2}$ is closed, differential output $I_p$ has a negative magnitude of −2I and differential output $I_m$ has a positive magnitude of +2I. During the first half of the clock cycle, as non-zero output current flows through differential outputs $I_p$ and $I_m$, the I-differential output signal is output to the I-filter 116.

In addition, during the first half of the clock cycle, AND gate 250C receives a low signal from $CLK_{BAR}$ and sends a zero value digital signal $137_{S3}$ to switch $S_{A3}$. Because digital signal $137_{S3}$ is zero in value, switch $S_{A3}$ is open. Further, during the first half of the clock cycle, because $CLK_{BAR}$ is low, $S_{B2}$ is open. Because switch $S_{A3}$ and switch $S_{B2}$ are both open during the first half of the clock cycle, no current is drawn through third current path CP3. Likewise, during the first half of the clock cycle, AND gate 250D receives a low signal from $CLK_{BAR}$ and sends a zero value digital signal $137_{S4}$ to switch $S_{A4}$. Because digital signal $137_{S4}$ is zero in value, switch $S_{A4}$ is open. In addition, during the first half of the clock cycle, because $CLK_{BAR}$ is low, switch $S_{B4}$ is open. Because switch $S_{A4}$ and switch $S_{B4}$ are both open during the first half of the clock cycle, no current is drawn through fourth current path CP4. During the first half of the clock cycle, because no current flows through differential outputs $Q_p$ and $Q_m$, the Q-differential output signal, which is taken off of CP3 and CP4, is not output to the Q-filter 118 and $Q_p$ and $Q_m$ do not send or draw any current. Accordingly, during the first half of the clock cycle, I-component 130 of analog signal 140, which consists of the I-differential signal, is output to the I-filter 116, and Q-component 134 of analog signal 140, which consists of the Q-differential output signal, is not output to the Q-filter.

During the second half of the clock cycle, AND gate 250A receives a low signal from CLK and sends a zero value digital signal $137_{S1}$ to switch $S_{A1}$. Because digital signal $137_{S1}$ is zero in value, switch $S_{A1}$ is open. In addition, during the first half of the clock cycle, because CLK is low, switch $S_{B1}$ is open. Because switch $S_{A1}$ and switch $S_{B1}$ are open during the second half of the clock cycle, no current is drawn through first current path CP1. Likewise, during the second half of the clock cycle, AND gate 250B receives a low signal from CLK and sends a zero value digital signal $137_{S2}$ to switch $S_{A2}$. Because digital signal $137_{S2}$ is zero in value, switch $S_{A2}$ is open. In addition, during the second half of the clock cycle, because CLK is low, switch $S_{B3}$ is open. Because switch $S_{A2}$ and switch $S_{B3}$ are open during the second half of the clock cycle, no current is drawn through second current path CP2. During the first half of the clock cycle, because no current flows through differential outputs $I_p$ and $I_m$, the I-differential output signal, which is taken off of CP1 and CP2, is not output to the I-filter 116.

In addition, during the second half of the clock cycle, AND gate 250C receives a high signal from $CLK_{BAR}$, and sends digital signal $137_{S3}$ corresponding to differential output signal $136_{Outp}$ to switch $S_{A3}$. Likewise, AND gate 250D receives a high signal from $CLK_{BAR}$, and sends digital signal $137_{S4}$ corresponding to differential output signal $136_{Outm}$ to switch $S_{A4}$. Because the output signals $136_{Outp}$ and $136_{Outm}$ of the quantizer 122 are inversely related, digital signals $137_{S3}$ and $137_{S4}$, which correspond to output signals $136_{Outp}$ and $136_{Outm}$, are also inversely related. Because digital signals $137_{S3}$ and $137_{S4}$ are inversely related, either switch $S_{A3}$ or switch $S_{A4}$ is closed, if $CLK_{BAR}$ is high.

In addition, during the second half of the clock cycle, because $CLK_{BAR}$ is high, both switch $S_{B2}$ and $S_{B4}$ are closed. If switch $S_{A3}$ is closed and switch $S_{A4}$ is open, current is drawn through third current path CP3. The current drawn to the output $Q_p$ is the difference between the current of current source 210 (4I) and the current of current source 230 (2I). The difference in current is sent to the differential output $Q_p$. In addition, because switch $S_{A4}$ is open and switch $S_{B4}$ is closed, current having a magnitude of −2I is drawn to the differential output $Q_m$. Accordingly, differential output $Q_p$ has a positive magnitude of +2I and the differential output $I_m$ has a negative magnitude of −2I. Similarly, if switch $S_{A3}$ is open and switch $S_{A4}$ is closed, differential output $Q_p$ has a negative magnitude of −2I and differential output $Q_m$ has a positive magnitude of +2I. During the second half of the clock cycle, as non-zero output current flows through differential outputs $Q_p$ and $Q_m$, the Q-differential output signal is output to the Q-filter 118. Accordingly, during the second half of the clock cycle, I-component 130 of analog signal 140, which consists of the I-differential signal, is not output to the I-filter 116, and Q-component 134 of analog signal 140, which consists of the Q-differential output signal, is output to the Q-filter 118.

FIG. 7 shows the relationship between CLK, $CLK_{BAR}$, and differential signals $I_p$, $I_m$, $Q_p$, and $Q_m$. During the first half of the clock cycle when CLK is high, $CLK_{BAR}$ is low, $I_p$ is 2I in magnitude, $I_m$ is −2I in magnitude, and $Q_p$, and $Q_m$ are zero in magnitude. Differential signals $I_p$ and $I_m$ are equal but opposite in magnitude because, as shown in FIG. 6, signal $I_p$ is based on the positive signal $136_{Outp}$ of differential ADC output signal 136 and signal $I_m$ is based on the negative signal $136_{Outm}$ of differential ADC output signal 136. During the second half of the clock cycle when CLK is low, $CLK_{BAR}$ is high, $Q_p$ is 2I in magnitude, $Q_m$ is −2I in magnitude, and $I_p$, and $I_m$ are zero in magnitude. Differential signals $Q_p$ and $Q_m$ are equal but opposite in magnitude because, as shown in FIG. 6, signal $Q_p$ is based on the positive signal $136_{Outp}$ of differential ADC output signal 136 and signal $Q_m$ is based on the negative signal $136_{Outm}$ of differential ADC output signal 136.

In one embodiment, the quantizer 122 outputs eight differential ADC output signals 136, which correspond to eight (i.e., two-to-the-third power) different levels of quantization. Accordingly, ADC 100 comprises eight logic circuits 124, where each logic circuit 124 receives one of the eight differential ADC output signals 136. In addition, each DAC 126a-c comprises eight DAC cells. DAC 126a comprises DAC cells 126a1-a8, DAC 126b comprises DAC cells 126b1-b8, and DAC 126c comprises DAC cells 126c1-c8.

The I-filter 116 and the Q-filter 118 in ADC 100 shown in FIGS. 2-4 are continuous time filters. The I-filter 116 and the Q-filter 118 may be op-amp-RC filters or gm-C filters.

Figure 8:
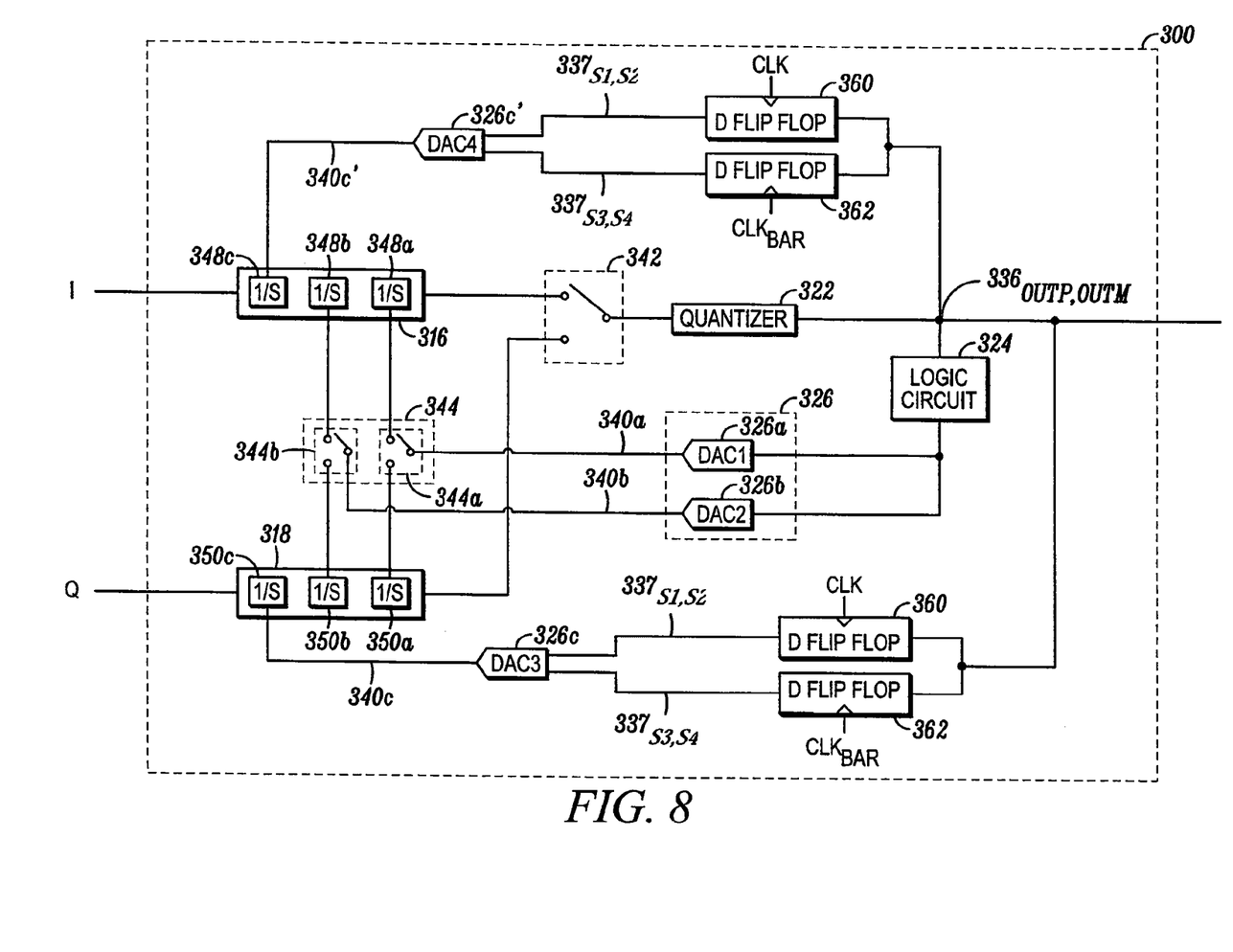
FIG. 8 shows an alternative embodiment of the ADC, where one of the DACs provides output only to the I-filter and another one of the DACs provides output only to the Q-filter.

FIG. 8 shows an alternative embodiment of an analog-to-digital converter. ADC 300 includes an I-filter 316, a Q-filter 318, a quantizer 322, and a switch 342 that alternatingly switches communication between the quantizer 322 and outputs of the I-filter 316 and the Q-filter 318. ADC 300 also includes switch 344. However, whereas switch 144 in ADC 100 consists of three switches 144a-c, where each switch 144a-c alternatingly switched communication between an output of a DAC 126a-c and an integrator 148a-c of the I-filter 116 and an integrator 150a-c of the Q-filter, switch 344 of ADC 300 comprises only two switches 344a, 344b. Switch 344a provides alternating communication between DAC 326a and integrator 348a of the I-filter 316 and integrator 350a of the Q-filter 318. Switch 344b provides alternating communication between DAC 326b and integrator 348b of the I-filter 316 and integrator 350b of the Q-filter 318. ADC 300 includes DACs 326c, c' that are not connected to switch 344. Instead the output of DAC 326c is directly output to integrator 350c of the Q-filter 318, and the output of DAC 326c' is directly output to integrator 348c of the I-filter 316.

ADC 300, as shown in FIG. 8, may be desirable when the signal-to-noise (SNR) performance of ADC 100 is too low. As explained above, logic circuit 324 outputs RZ signals to DAC 326. However, jitter may increase, causing the SNR to degrade when RZ signals are used. As explained above, RZ signals are needed in order to switch between providing an output to the I-filter 116 and the Q-filter 118. If no switching between filters 116, 118 is involved, as is the case where DAC 326c directly provides output to integrator 350c and DAC 326c' directly provides output to integrator 348c, DACs 326c, 326c' receive output signal 336 from the quantizer 322 through two storage devices 360, 362 and output non-return-to-zero (NRZ) analog signals 340c, 340c'. In one example, the storage devices 360, 362 are D flip flops. A logic block 324 to convert output signal 336 to RZ signals is not needed. Having NRZ signals as inputs to the integrators 348c, 350c, as shown in FIG. 8, improves the SNR.

Figure 9:
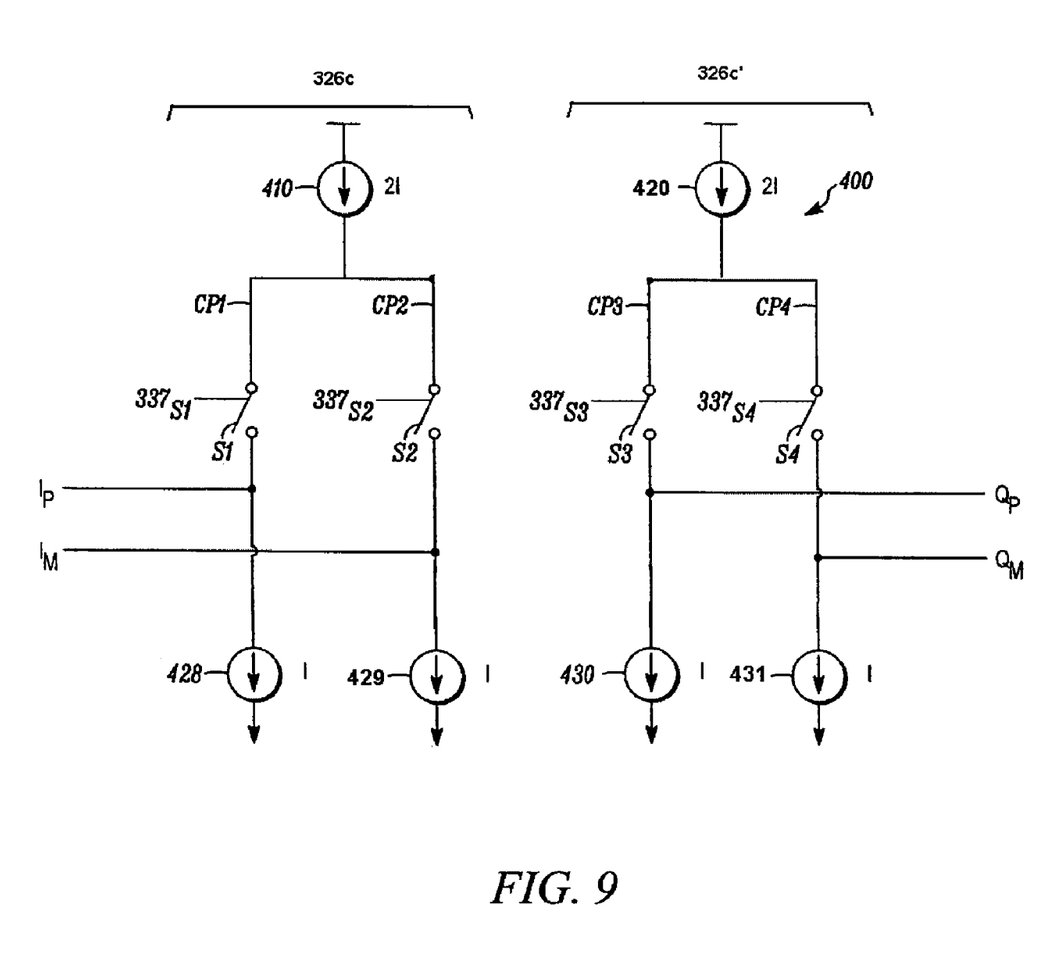
FIG. 9 is a schematic of a non-return-to-zero DAC shown in FIG. 8.

In ADC 300 shown in FIG. 8, DAC1 326a and DAC2 326b in ADC 300 may have the configuration of DAC 126 as shown in FIG. 5 (hereafter referred to as RZ DACs). In one example, DAC3 326c and DAC4 326 c' comprise NRZ DACs. FIG. 9 shows one example of a NRZ DAC. In FIG. 9, differential output signal $337_{S1}$ is applied to switch $S_1$, differential output signal $337_{S2}$ is applied to switch $S_2$, differential output signal $337_{S3}$ is applied to switch $S_3$, and differential output signal $337_{S4}$ is applied to switch $S_4$. Differential output signals $337_{S1}$ and $337_{S2}$ are inversely related. At the rising edge of CLK, when CLK becomes high, the status of switch $S_1$ and switch $S_2$ are reversed if $336_{Outp}$ and $336_{Outm}$ are reversed. For example, if prior to the rising edge of CLK, switch $S_1$ is closed and switch $S_2$ is open, then at the rising edge of CLK, $S_1$ is open and $S_2$ is closed. Switch $S_1$ is open and switch $S_2$ is closed due to D flip flop 360, which uses CLK as an input signal. But always, either switch $S_1$ or switch $S_2$ is closed, and the other is open. If switch $S_1$ is closed and switch $S_2$ is open, current is drawn to through the first current path CP1. The current drawn through CP1 is the difference between the current of current source 410 (2I) and the current of current source 428 (I). The difference in current, which has a magnitude of +I, is sent to the differential output $I_p$. In addition, because switch $S_2$ is open, current having a negative magnitude of –I is drawn to the differential output $I_m$. Similarly, if switch $S_1$ is open and switch $S_2$ is closed, differential output $I_p$ has a negative magnitude of –I and differential output $I_m$ has a positive magnitude of +I.

Similarly, at the rising edge of $CLK_{BAR}$, when $CLK_{BAR}$ becomes high, the status of switch $S_3$ and switch $S_4$ are reversed if output signal $336_{Outp}$ and output signal $336_{Outm}$ are reversed. For example, if prior to the rising edge of $CLK_{BAR}$ switch $S_3$ is closed and switch $S_4$ is open, then at the rising edge of $CLK_{BAR}$, switch $S_3$ is open and switch $S_4$ is closed. Switch $S_3$ is open and switch $S_4$ is closed due to D flip flop 362, which uses $CLK_{BAR}$ as an input signal. But always, either switch $S_3$ or switch $S_4$ is closed, and the other is open. If switch $S_3$ is closed and switch $S_4$ is open, current is drawn through third current path CP3. The current drawn through CP3 is the difference between the current of current source 410 (2I) and the current of current source 430 (I). The difference in current, which has a magnitude of +I, is sent to the differential output $Q_p$. In addition, because switch $S_4$ is open, current having a negative magnitude of –I is drawn to the differential output $Q_m$. Similarly, if switch $S_3$ is open and switch $S_4$ is closed, differential output $Q_p$ has a negative magnitude of –I and differential output $Q_m$ has a positive magnitude of +I.

Another example of a NRZ DAC is a switched-cap DAC. Switched-cap DACs utilize capacitors, which use both halves of the clock cycle—the first half for sampling and the second half for discharging. Consequently, switched-cap DACs are not shared between the I-filter 316 and the Q-filter 318. As shown in FIG. 8, DAC3 326c and DAC4 326c' are not shared between the I-filter 316 and the Q-filter 318 and may be switched-cap DACs. DAC1 326a and DAC2 326b are shared between the I-filter 316 and the Q-filter 318 and may be RZ DACs.

Referring back to FIG. 8, differential signals $337_{S1}$ and $337_{S2}$ are inversely related during both halves of the clock cycle, and differential signals $337_{S3}$ and $337_{S4}$ are inversely related during both halves of the clock cycle using D flip flops 360, 362. The differential output signals $336_{Outp}$, $336_{Outm}$ are sent to D flip flops 360, 362. Signals $337_{S1}$ and $337_{S2}$ are output from D flip flop 360 operating with CLK and are sent to switches $S_1$ and $S_2$. Signals $337_{S3}$ and $337_{S4}$ are output from D flip flop 362 operating with $CLK_{BAR}$ and are sent to switches $S_3$ and $S_4$.

Figure 10:
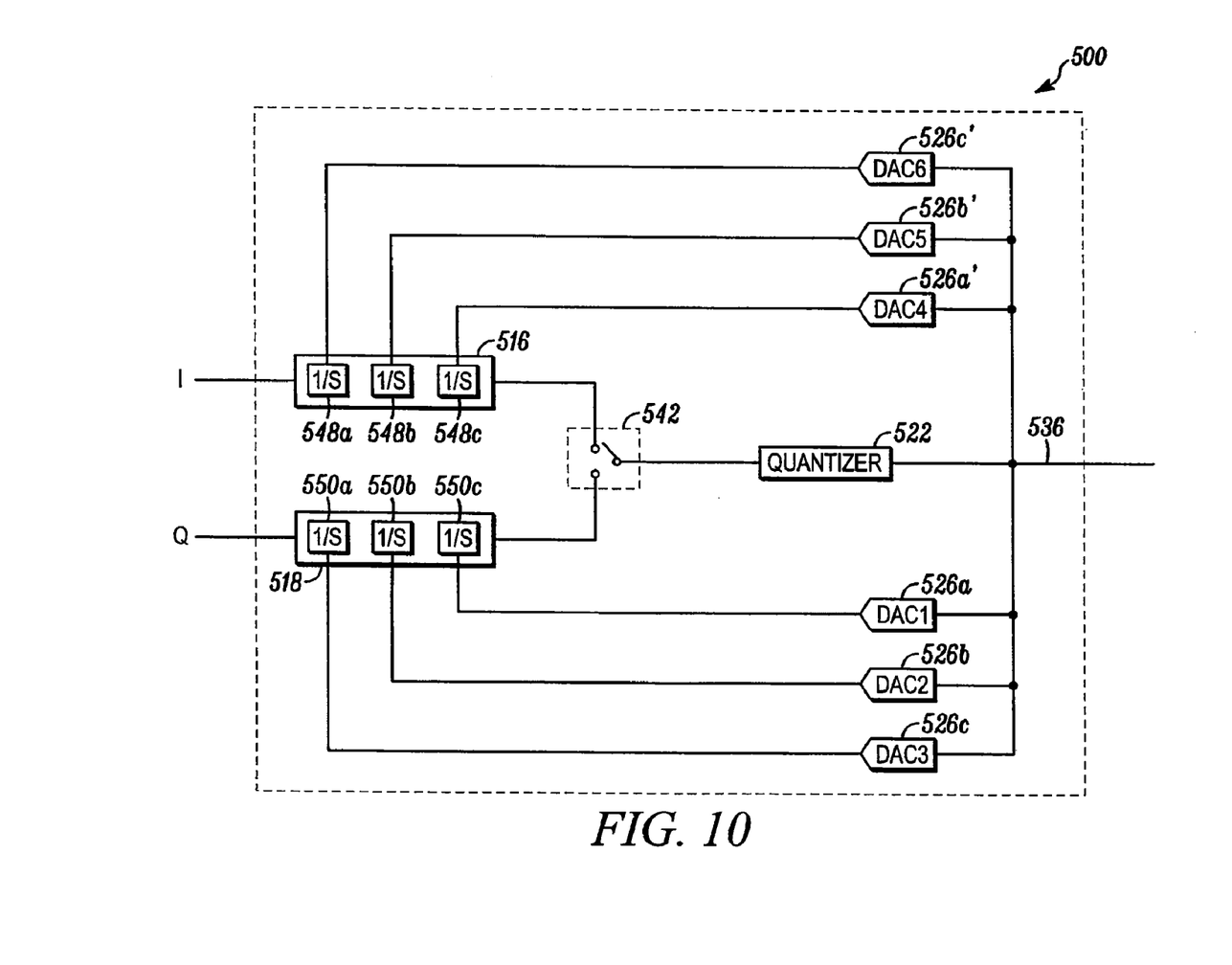
FIG. 10 shows another alternative embodiment of the ADC, where a switch alternates connection between the quantizer and the filters, and where a first set of DACs provides output only to the I-filter, and a second set of DACs provides output only to the Q-filter.

FIG. 10 shows an alternative embodiment of an analog-to-digital converter. ADC 500 includes an I-filter 516, a Q-filter 518, a quantizer 522, and a switch 542 that provides alternating communication between the quantizer 522 and the I-filter 516 and the Q-filter 518. However, ADC 500 does not include a switch that provides alternating communication between the output of the DACs and the I-filter 516 and the Q-filter 518. Instead, ADC 500 includes six DACs, DAC1 526a, DAC2 526b, DAC3 526c, DAC4 526a', DAC5 526b', DAC6 526c'. DACs 526a-c are directly input to integrators 550a-c of the Q-filter 518 and DACs 526a'-c' are directly input to integrators 548a-c of the I-filter 516. ADC 500 may be used when DACs 526 are all switched-cap DACs. As explained above, switched-cap DACs, which utilize capacitors, do not alternatingly switch between outputting a current signal to the I-filter 516 and a current signal to the Q-filter 518 because the nature of capacitors require one half of the clock cycle for sampling and the other half of the clock cycle for discharging. Therefore, separate DACs 426 are used for the I-filter 516 and the Q-filter 518.

The foregoing description of various embodiments of the invention has been presented for purposes of illustration and description. It is not intended to be exhaustive or to limit the invention to the precise embodiments disclosed. Numerous modifications or variations are possible in light of the above teachings. The embodiments discussed were chosen and described to provide the best illustration of the principles of the invention and its practical application to thereby enable one of ordinary skill in the art based on the disclosure and teachings provided herein to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

We claim:

1. An analog-to-digital converter (ADC) comprising:
   a quantizer;
   a first filter;
   a second filter;
   at least one digital-to-analog converter (DAC); and
   a multiplexer configured to alternate connection of the quantizer with the first filter and the second filter, and to alternate connection of the at least one DAC with the first filter and the second filter.

2. The ADC of claim 1, wherein the first filter is connected to the at least one DAC when the quantizer is connected to the second filter, and wherein the second filter is connected to the at least one DAC when the quantizer is connected to the first filter.

3. The ADC of claim 2, wherein for a first half of a clock cycle, the first filter is connected to the at least one DAC and the quantizer is connected to the second filter; and wherein for a second half of the clock cycle, the second filter is connected to the at least one DAC and the quantizer is connected to the first filter.

4. The ADC of claim 1, wherein the multiplexer comprises:
   a first switch configured to alternate connection of an input of the quantizer with an output of the first filter and an output of the second filter; and
   a second switch configured to alternate connection of an output of the DAC with an input of the first filter and an input of the second filter.

5. The ADC of claim 1, wherein the multiplexer comprises a first switch configured to alternate connection of an input of the quantizer with an output of the first filter and an output of the second filter, and wherein the DAC is configured to alternatingly output an analog signal to the first filter and the second filter.

6. The ADC of claim 5, wherein the DAC comprises:
   a plurality of switches; and
   a plurality of current paths connected in parallel, the current paths in connection with the plurality of switches;
   wherein the plurality of switches controls current flow through the plurality of current paths; and
   wherein the analog signal is based on the current flow through the plurality of current paths.

7. The ADC of claim 6, wherein the analog signal comprises a first component and a second component,
   wherein the first component and the second component are based on current flow through at least one of the plurality of current paths, the first component and the second component being based on different current paths; and
   wherein the at least one DAC is configured to alternatingly output the first component to the first filter and the second component to the second filter.

8. The ADC of claim 6, wherein the plurality of switches comprises a first set of switches and a second set of switches, each of the plurality of current paths having one switch from the first set of switches, and each of the plurality of current paths having one switch from the second set of switches,
   wherein operation of the first set of switches is controlled by a signal based on the output of the quantizer, and
   wherein operation of the second set of switches is controlled by a clock signal.

9. The ADC of claim 8, wherein the signal based on the output of the quantizer comprises a plurality of return-to-zero (RZ) signals, each RZ signal being applied to a different switch of the first set of switches.

10. The ADC of claim 9, further comprising a logic circuit configured to convert the output of the quantizer to the plurality of RZ signals.

11. A method for converting a first signal and a second signal to a digital output signal, the method comprising:
    receiving the first signal in a first filter;
    receiving the second signal in a second filter;
    alternate receiving and sampling with a quantizer of a filtered first signal from the first filter and a filtered second signal from the second filter;
    sending an output signal of the quantizer to at least one digital-to-analog converter (DAC) in a feedback loop; and
    alternate sending the output signal of the at least one DAC to the first filter and the second filter.

12. The method of claim 11, wherein alternate sampling with the quantizer of the filtered first signal from the first filter and the filtered second signal from the second filter comprises:
    sampling the filtered first signal with the quantizer when the at least one DAC is sending the output signal of the DAC to the second filter; and
    sampling the filtered first signal with the quantizer when the at least one DAC is sending the output signal of the DAC to the first filter.

13. The method of claim 11, wherein alternate sampling with the quantizer of the filtered first signal from the first filter and the filtered second signal from the second filter comprises:
    sampling one of the filtered first signal from the first filter and the filtered second signal from the second filter during a first half of a clock cycle, and
    sampling the other of the filtered first signal from the first filter and the filtered second signal from the second filter during a second half of the clock cycle.

14. The method of claim 11, wherein alternate sending of the output signal of the at least one DAC to the first filter and the second filter comprises:
    sending the output signal of the at least one DAC to the first filter when sampling the filtered second signal; and
    sending the output signal of the at least one DAC to the second filter when sampling the filtered first signal.

15. The method of claim 11, wherein sending the output of the quantizer to the at least one DAC comprises:
    converting the output of the quantizer to a plurality of return-to-zero signals; and
    sending the plurality of the return-to-zero signals to the at least one DAC.

* * * * *